United States Patent
Hosek et al.

(10) Patent No.: US 11,584,000 B2
(45) Date of Patent: Feb. 21, 2023

(54) ROBOT ARM WITH UNEQUAL LINK LENGTHS AND VARIABLE NON-LINEAR WRIST ORIENTATION

(71) Applicant: Persimmon Technologies, Corp., Wakefield, MA (US)

(72) Inventors: Martin Hosek, Lowell, MA (US); Scott Wilkas, Lexington, MA (US); Jacob Lipcon, Arlington, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 756 days.

(21) Appl. No.: 15/212,441

(22) Filed: Jul. 18, 2016

(65) Prior Publication Data

US 2017/0028546 A1 Feb. 2, 2017

Related U.S. Application Data

(60) Provisional application No. 62/193,293, filed on Jul. 16, 2015.

(51) Int. Cl.
| | |
|---|---|
| *H01L 21/677* | (2006.01) |
| *B25J 9/04* | (2006.01) |
| *B25J 9/10* | (2006.01) |
| *B25J 11/00* | (2006.01) |

(52) U.S. Cl.
CPC ............... *B25J 9/042* (2013.01); *B25J 9/104* (2013.01); *B25J 11/0095* (2013.01); *H01L 21/67742* (2013.01)

(58) Field of Classification Search
CPC ....................................................... B25J 9/042
See application file for complete search history.

(56) References Cited

U.S. PATENT DOCUMENTS

| | | | |
|---|---|---|---|
| 4,865,577 A | 9/1989 | Freudenstein | ................ 474/141 |
| 9,149,936 B2 | 10/2015 | Hosek et al. | ............ B25J 18/04 |
| 2007/0020082 A1* | 1/2007 | Caveney | ................. B25J 9/042 |
| | | | 414/744.5 |
| 2016/0263742 A1 | 9/2016 | Hosek et al. | ............ B25J 9/042 |

OTHER PUBLICATIONS

Hosek, Martin, "Arm Mechanisms With Two End-Effectors", U.S. Appl. No. 62/135,490, filed Mar. 19, 2015, 15 pgs.
Hosek, Martin, "Robot Arm Mechanisms With Two End-Effectors", U.S. Appl. No. 62/137,458, filed Mar. 24, 2015, 20 pgs.

* cited by examiner

*Primary Examiner* — Gerald McClain
(74) *Attorney, Agent, or Firm* — Harrington & Smith (57) ABSTRACT

A substrate transport arm including a first link; a second link rotatably connected to the first link; a third link rotatably connected to the second link at a wrist joint; and a mechanical transmission having a pulley. The third link includes an end effector configured to support a substrate thereon. The mechanical transmission is connected to the third link to control rotation of the third link on the second link. The mechanical transmission is configured to control rotation of the third link as a function of an angle between the first and second links such that, as the first and second links are rotated relative to each other, the wrist joint follows a wrist path which includes a curved portion, and where a center of the substrate supported on the end effector is moved along a substantially straight substrate path as the wrist joint follows the curved portion.

13 Claims, 9 Drawing Sheets

ROBOT ARM WITH UNEQUAL LINK LENGTHS AND VARIABLE NON-LINEAR WRIST ORIENTATION

CROSS REFERENCE TO RELATED APPLICATION

This application claims priority on U.S. provisional application No. 62/193,293 filed Jul. 16, 2015 which is hereby incorporated by reference in its entirety.

BACKGROUND

Technical Field

The exemplary and non-limiting embodiments relate generally to a robot arm and, more particularly, to controlling movement of a substrate by a robot arm.

Brief Description of Prior Developments

Substrate transport apparatus having a scara arm and an end effector are known.

SUMMARY

The following summary is merely intended to be exemplary. The summary is not intended to limit the scope of the claims.

In accordance with one aspect, an example embodiment is provided in a substrate transport arm comprising a first link; a second link rotatably connected to the first link; a third link rotatably connected to the second link at a wrist joint, where the third link comprises an end effector configured to support a substrate thereon; and a mechanical transmission comprising a pulley, where the mechanical transmission is connected to the third link to control rotation of the third link on the second link, where the mechanical transmission is configured to control rotation of the third link as a function of an angle between the first and second links such that, as the first and second links are rotated relative to each other, the wrist joint follows a wrist path which comprises a curved portion, and where a center of the substrate supported on the end effector is moved along a substantially straight substrate path as the wrist joint follows the curved portion of the wrist path.

In accordance with another aspect, an example method comprises connecting links in series to at least partially form a substrate arm, where the links comprise: a first link, a second link rotatably connected to the first link, and a third link rotatably connected to the second link at a wrist joint, where the third link comprises an end effector configured to support a substrate thereon; and connecting a mechanical transmission to the third link, where the mechanical transmission is configured to control rotation of the third link on the second link as a function of an angle between the first and second links, where the mechanical transmission comprises a pulley, and where the mechanical transmission is configured such that, as the first and second links are rotated relative to each other: the wrist joint follows a wrist path which comprises a curved portion, and a center of the substrate supported on the end effector is moved along a substantially straight substrate path as the wrist joint follows the curved portion of the wrist path.

In accordance with another aspect, an example method comprises moving a second link relative to a first link of a substrate transport arm, where the substrate transport arm comprises the second link being rotatably connected to the first link, and a third link rotatably connected to the second link at a wrist joint, where the third link comprises an end effector configured to support a substrate thereon; and moving the third link relative to the second link as the second link is moved relative to the first link, where a mechanical transmission is connected to the third link and at least partially controls rotation of the third link on the second link as a function of an angle between the first and second links, where the mechanical transmission comprises a pulley, and where the mechanical transmission at least partially limits movement of the third link relative to the second link such that: the wrist joint follows a wrist path which comprises a curved portion, and a center of the substrate supported on the end effector is moved along a substantially straight substrate path as the wrist joint follows the curved portion of the wrist path.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
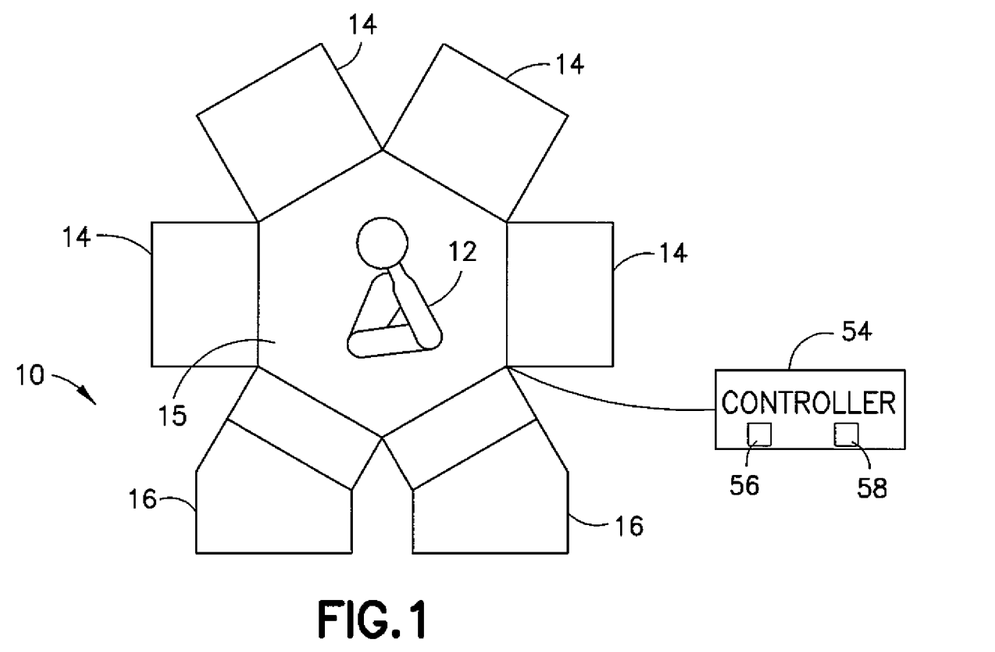
FIG. 1 is a schematic view of a substrate processing apparatus.

Referring to FIG. 1, there is shown a schematic top plan view of an example substrate processing apparatus 10 having a substrate transport apparatus 12. Although the present invention will be described with reference to the embodiments shown in the drawings, it should be understood that the present invention may be embodied in many forms of alternative embodiments. In addition, any suitable size, shape or type of materials or elements could be used.

In addition to the substrate transport apparatus 12, the substrate processing apparatus 10 includes multiple substrate processing chambers 14 and substrate cassette elevators 16 connected to a vacuum chamber 15. The substrate transport apparatus 12 is located, at least partially, in the chamber 15 and is adapted to transport planar substrates, such as semiconductor wafers or flat panel displays, between and/or among the chambers 14 and elevators 16. In alternate embodiments, the transport apparatus 12 could be used in any suitable type of substrate processing apparatus. One or more controllers 54 are provided to control the substrate transport apparatus 12 and the substrate processing chambers 14 and substrate cassette elevators 16. The controller(s) 54 may comprise one or more processors 56 and one or more memories 58.

Figure 2:
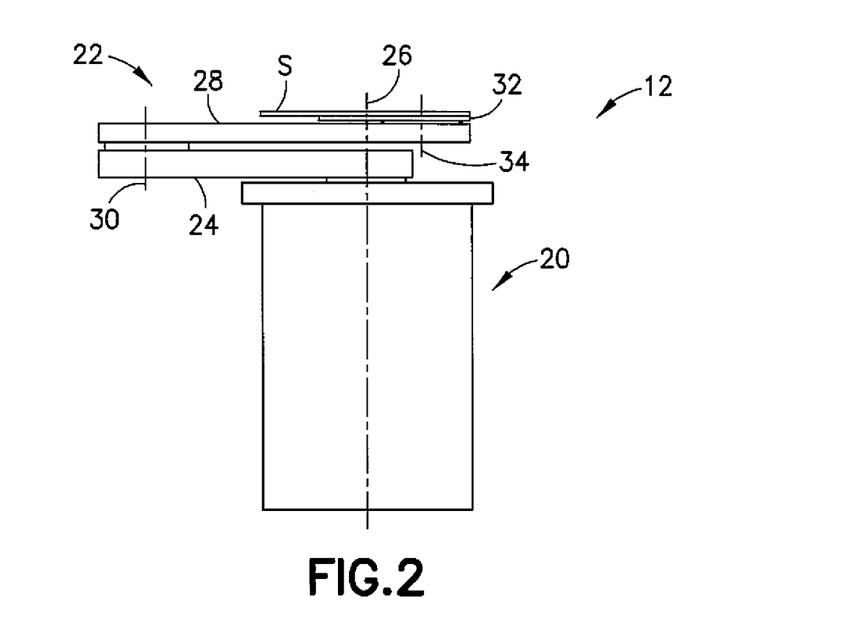
FIG. 2 is a side view of the substrate transport apparatus shown in FIG. 1.
Figure 3:
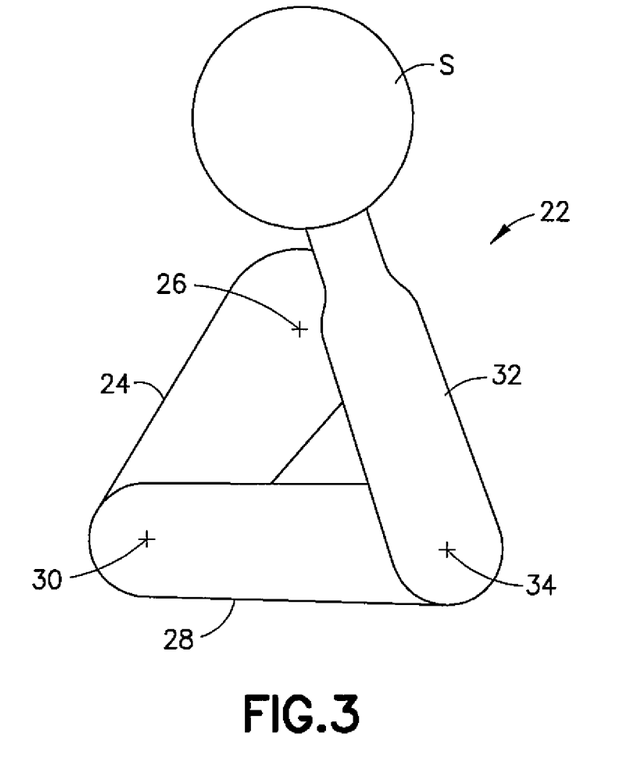
FIG. 3 is a schematic top plan view of the robot arm shown in FIG. 2 with a substrate thereon.

Referring also to FIGS. 2 and 3, the substrate transport apparatus or robot 12 includes a drive 20 and an arm 22. The arm 22 is shown in a retracted position. Arm 22 has an upper arm or first link 24 rotatable about a central axis of rotation 26 of the drive 12. Arm 22 further has a forearm or second link 28 rotatable about an elbow axis of rotation 30. Arm 22 further has an end effector or third link 32 rotatable about a wrist axis of rotation 34. The end effector 32 is configured to removably support a substrate S thereon. The arm 22 is configured to cooperate with drive 20 such that substrate S is transported into and out of the chambers 14, 16.

Figure 4:
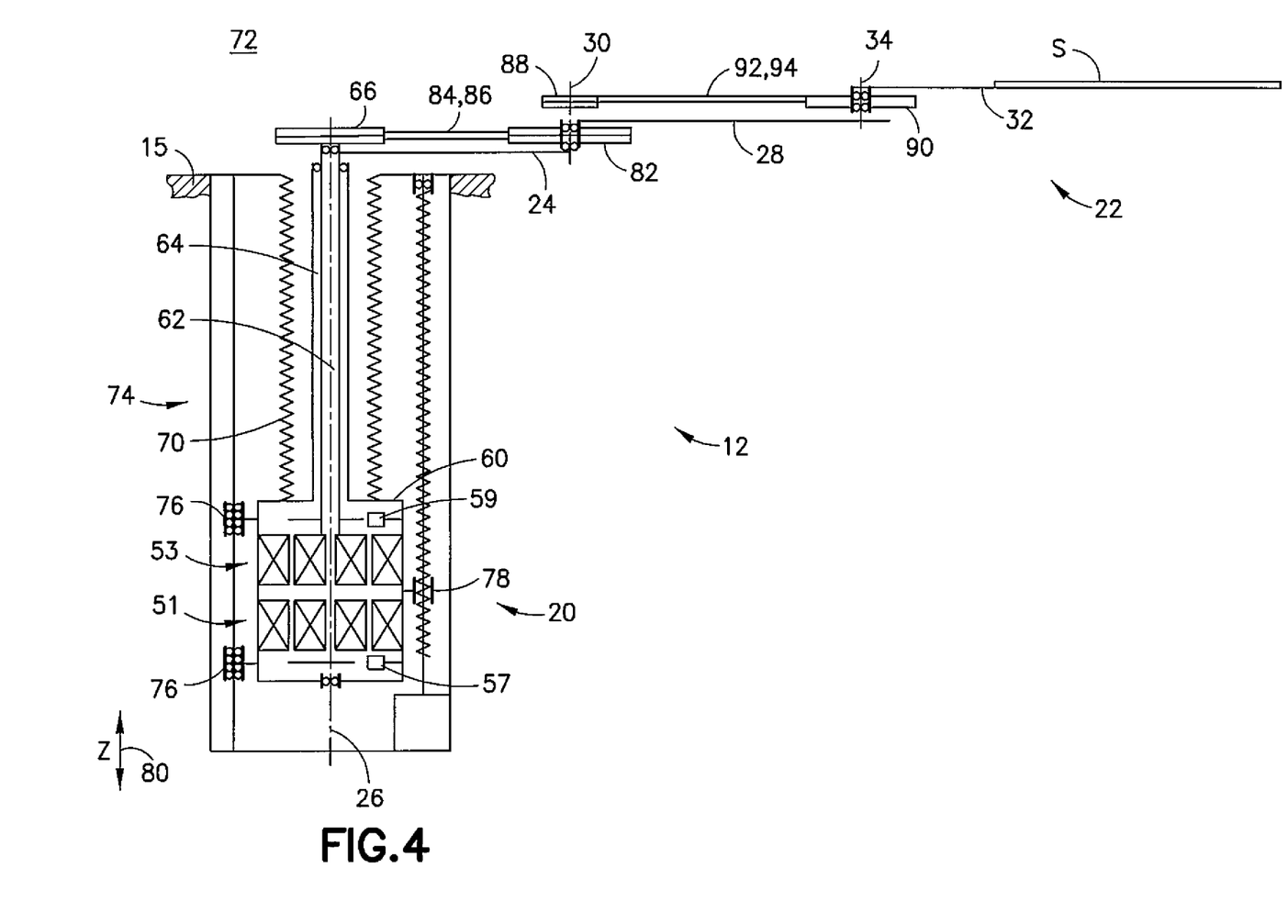
FIG. 4 is a schematic illustration of the substrate transport apparatus shown in FIGS. 1-3.
Figure 5:
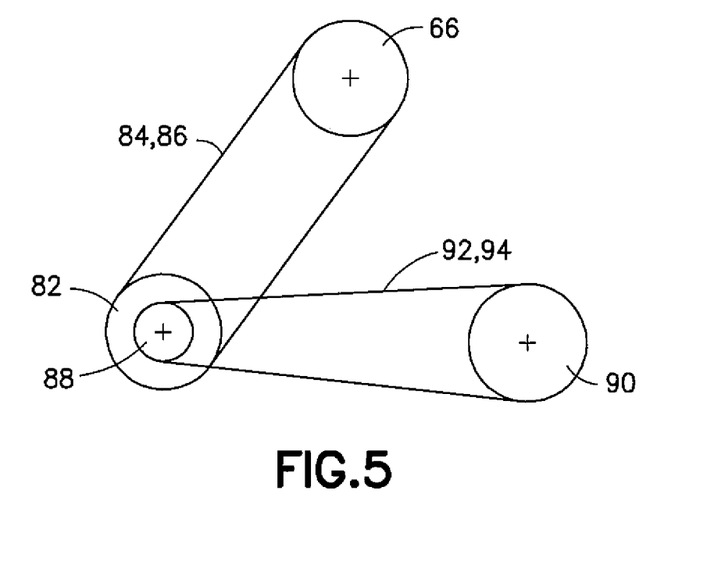
FIG. 5 is a schematic illustration of the mechanical transmission in the robot arm shown in FIGS. 1-4.
Figure 6A:
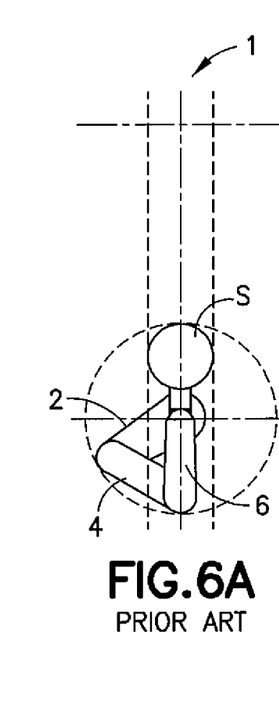
FIGS. 6A-6E show a schematic illustration of a convention robot arm movement.
Figure 6B:
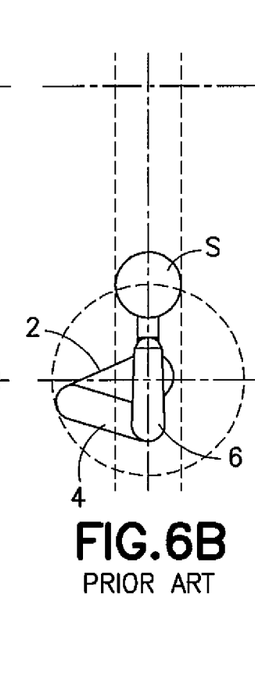
Figure 6C:
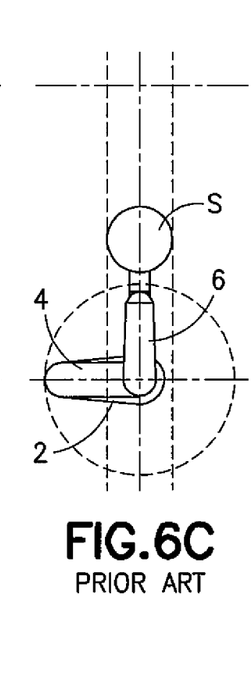
Figure 6D:
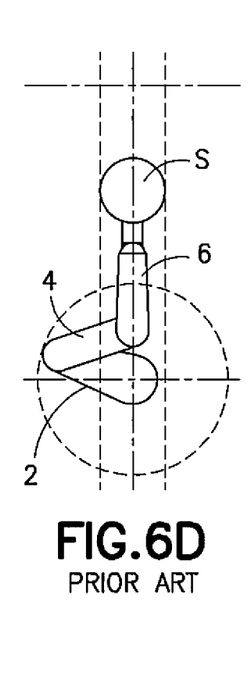
Figure 6E:
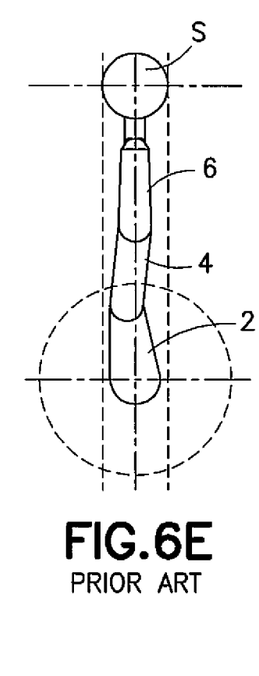
Figures 7A, 7B:
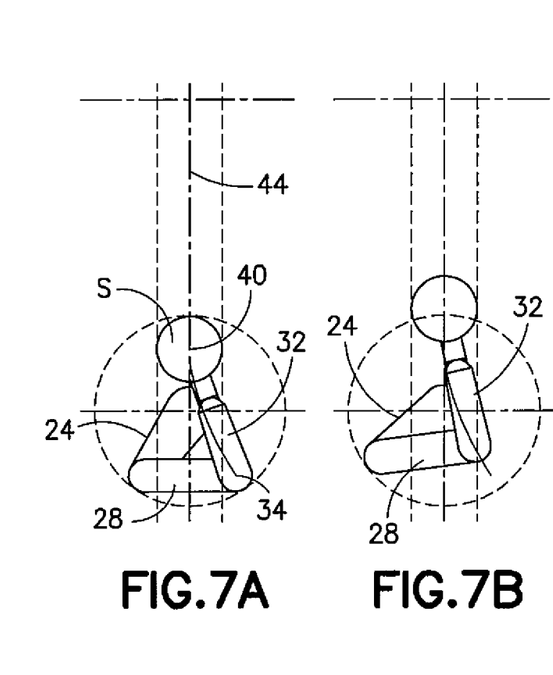
FIGS. 7A-7E show a schematic illustration of robot arm movement of the arm shown in FIGS. 1-5.
Figure 7C:
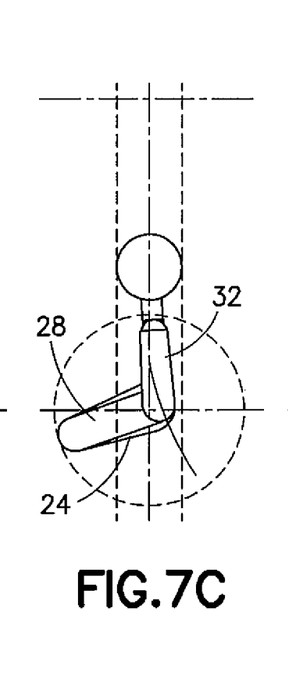
Figure 7D:
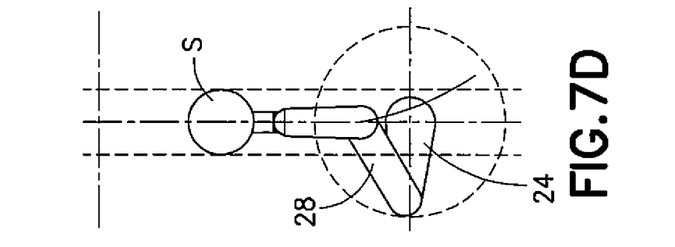
Figure 7E:
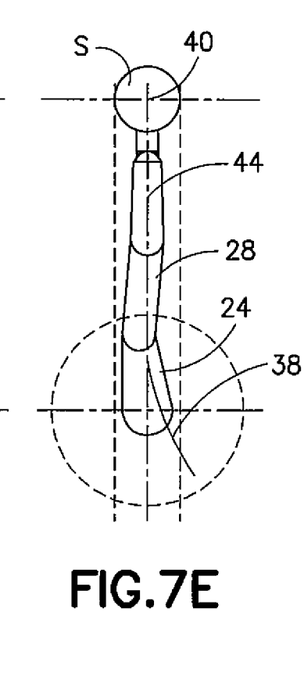
Figure 8A:
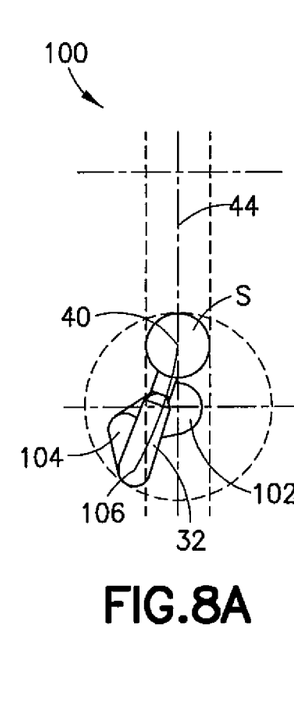
FIGS. 8A-8E show a schematic illustration of a robot arm movement similar to FIGS. 7A-7E of an alternate embodiment.
Figure 8B:
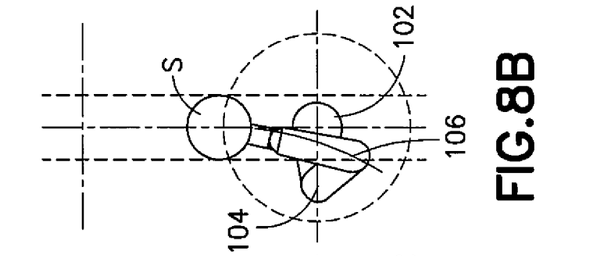
Figure 8C:
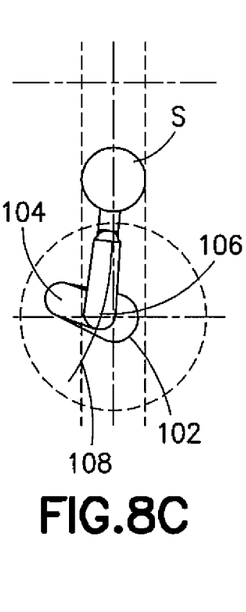
Figure 8D:
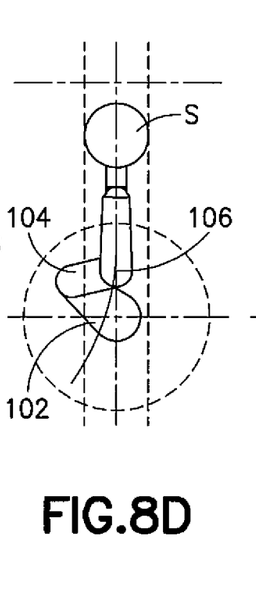
Figure 8E:
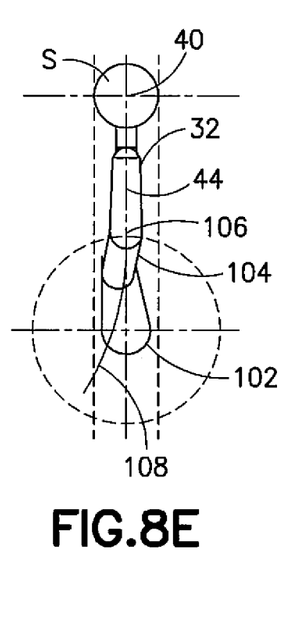
Figure 9A:
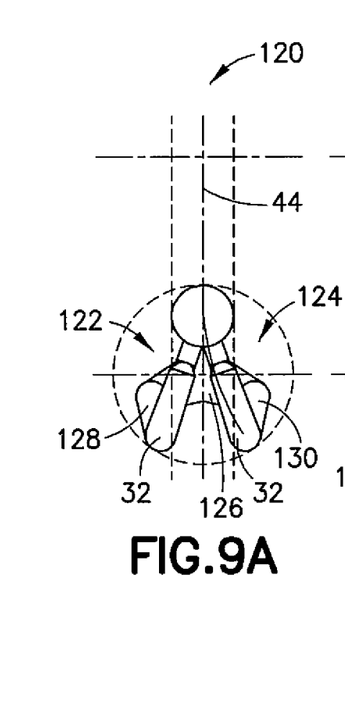
FIGS. 9A-9E show a schematic illustration of a robot arm movement similar to FIGS. 7A-7E of an alternate embodiment.
Figure 9B:
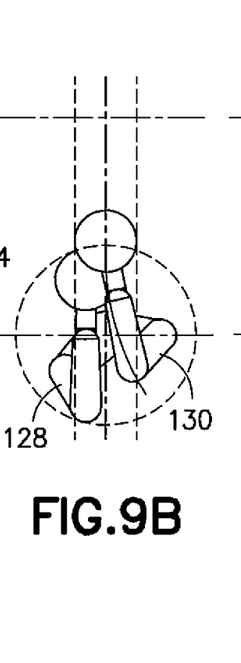
Figure 9C:
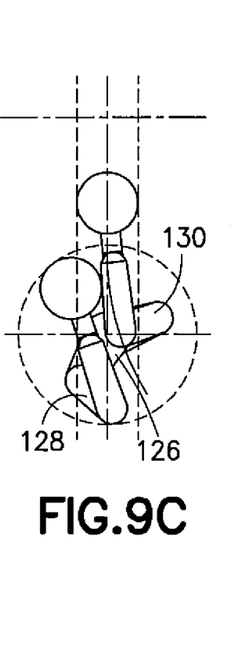
Figure 9D:
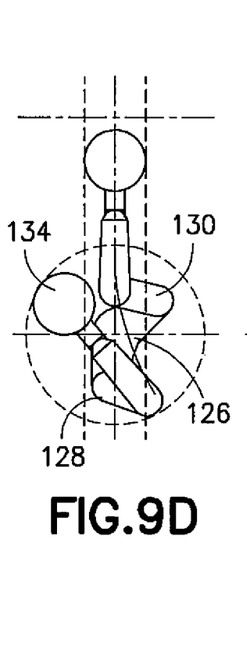
Figure 9E:
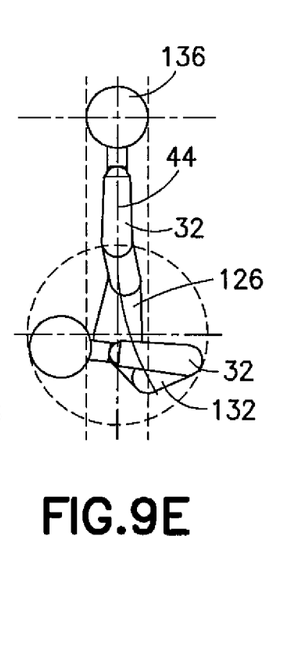
Figure 10A:
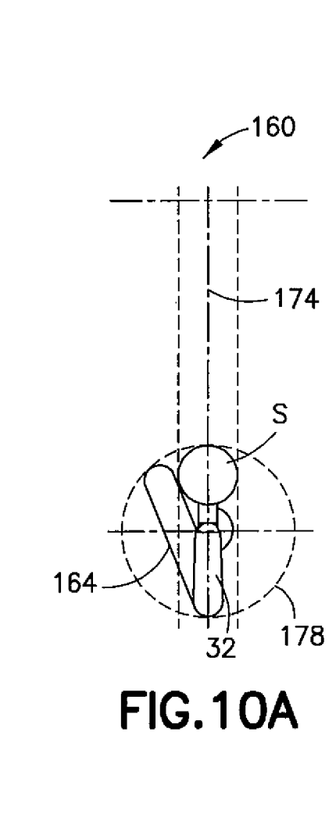
FIGS. 10A-10E show a schematic illustration of a robot arm movement similar to FIGS. 7A-7E of an alternate embodiment.
Figure 10B:
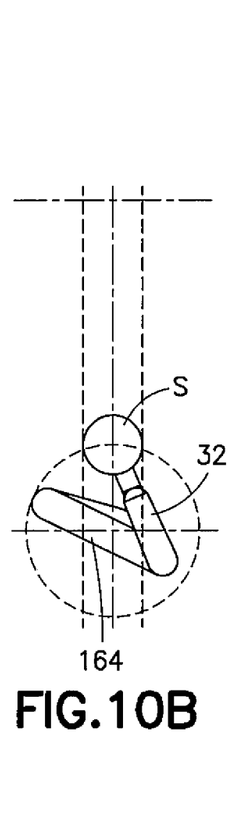
Figure 10C:
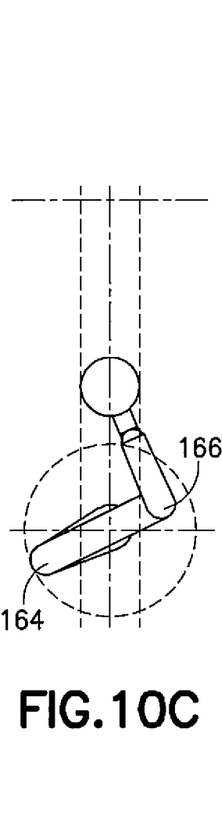
Figure 10D:
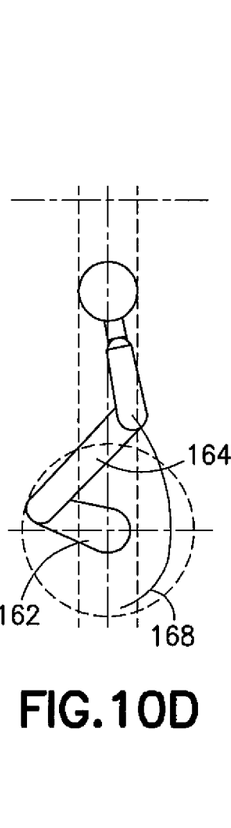
Figure 10E:
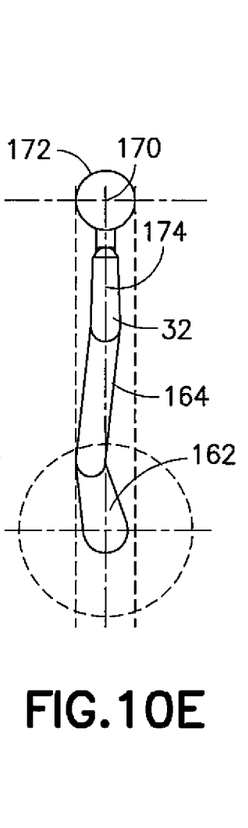

Referring also to FIG. 4, the drive 20, in this example, has first and second motors 51, 53 with corresponding first and second encoders 57, 59 coupled to housing 60 and respectively driving first and second shafts 62, 64. Referring also to FIG. 5, the shaft 62 may be coupled to pulley 66 and shaft 64 may be coupled to upper arm 24; where shafts 62, 64 may be concentric or otherwise disposed. In alternate aspects, any suitable drive may be provided. Housing 60 may be in communication with chamber 15 where bellows 70, chamber 15 and an internal portion of housing 60 isolate a vacuum environment 72 from an atmospheric environment 74. Housing 60 may slide in a z direction as a carriage on slides 76 where a lead screw or other suitable vertical or linear z drive 78 may be provided to selectively move housing 60, and arm 22 coupled thereto, in a Z-direction 80. In the embodiment shown, upper arm 24 is driven by motor 51 about the central axis of rotation 26. Similarly, forearm 28 is driven by motor 53 through a band drive having pulleys 66, 82 and bands 84, 86. In alternate aspects, any suitable structure may be provided to drive forearm 28 with respect to upper arm 24. The ratio between pulleys 66 and 82 may be 1:1, 2:1 or any suitable ratio. Third link 32 with the end-effector may be constrained by a band drive having pulley 88 grounded with respect to link 24, pulley 90 grounded with respect to end effector or third link 32 and bands 92, 94 constraining pulley 88 and pulley 90. The ratio between pulleys 88, 90 may not be constant in order for third link 32 to track a path with rotation during extension and retraction of arm 22. This may be accomplished where pulleys 88, 90 may be one or more non-circular pulleys, such as two non-circular pulleys or where one of pulley 88, 90 may be circular and the other being non-circular. Alternately, any suitable coupling or linkage may be provided to constrain the path of the third link or end effector 32 as described. The embodiment is described with respect to pulley 90 being non-circular and pulley 88 being circular. Alternately, pulley 68 may be non-circular and pulley 90 circular. Alternately, pulleys 88 and 92 may both be non-circular or any suitable coupling may be provided to constrain the links of arm 14 as described. By way of example, non-circular pulleys or sprockets are described in U.S. Pat. No. 4,865,577 issued on Sep. 12, 1989 and entitled Noncircular Drive which is hereby incorporated by reference herein in its entirety. Alternately, any suitable coupling may be provided to constrain the links of arm 22 as described, for example, any suitable variable ratio drive or coupling, linkage gears or sprockets, cams or otherwise used alone or in combination with a suitable linkage or other coupling. In the embodiment shown, elbow pulley 88 is coupled to upper arm 24 and is shown round or circular where wrist pulley 90 coupled to wrist or third link 32 is shown non circular.

Makers of industrial robots are constantly pushed to deliver products with greater performance at a lower overall price. One measure of performance is overall arm reach compared to containment volume when the arm is retracted. One way to improve arm reach for a multi-link robot arm is to increase individual link lengths to maximize overall arm reach for a given containment area when the arm is retracted. A link length may be measured between two opposite axis of rotation on the link. A traditional low cost solution for semiconductor applications is a three link arm with revolute joints where the first two links are controlled by independent motors and the last link is controlled by a mechanical transmission that rotates the last link as a linear function of the angle between the first and second link as seen in FIGS. 6A-6E being a traditional equal link length arm. Overall arm reach can be increased for the same containment volume by increasing the link length of the 2nd link. This typically requires a third motor to control the rotation of the last link which increases cost and makes the performance benefit less attractive. An alternate approach is to use a variable non-linear mechanical transmission to control the rotation of the last link which provides the performance benefits of the extended arm reach while maintaining the cost of the traditional solution. The variable transmission ratio may be implemented, for instance, using at least one pulley with a non-circular profile. As an example, the wrist pulley may feature a non-circular profile. An example of an arm that utilizes non circular pulleys is disclosed in U.S. patent application Ser. No. 13/833,732 filed Mar. 15, 2013 and entitled "Robot Having Arm With Unequal Link Lengths" which is hereby incorporated by reference herein in its entirety. This same arm concept can be used to construct a dual arm where the first and second links of each independent arm occupy the same vertical space in a side by side arrangement. The end result is a compact dual arm with a short overall stack height. This produces a lower cost robot arm due to less parts, but also provides a substantial cost savings at the next tier supplier because the robot arm will fit in a smaller volume vacuum chamber which requires less raw material to manufacture and reduced operational costs due to smaller vacuum pumps required to maintain the desired vacuum level in a smaller volume vacuum chamber. FIGS. 6A-6E show a traditional equal link length arm 1. Here, the link lengths may be the distance between joints where arm 10 has upper arm 2, forearm 4 and wrist and end effector 6.

Referring now to FIG. 7A-7E there is shown the unequal link length single arm 22 with short upper first link 24 and long second link 28. Here, a robot arm linkage is shown with unequal first and second link lengths actuated by motors and a variable non-linear mechanical transmission to control the third link 32 as a function of the angle between the first and second links. Here, the variable transmission may be defined to constrain the wrist joint 34 to follow a non-linear path 38 while the center 40 of substrate S follows a linear path 44. This type of arm linkage configuration may increase overall arm reach for a given containment envelope and reduce overall height of a dual arm linkage. Here, two independent arms can occupy the same elevation when compared to competing designs that use stacked arm links and/or a bridge on the upper arm to clear the payload on the lower arm. The variable transmission ratio may be implemented as described below or, for instance, using at least one pulley with a non-circular profile. As an example, the wrist pulley (or other pulley(s)) may feature a non-circular profile. An example of an arm that utilizes non circular pulleys is disclosed in U.S. patent application Ser. No. 13/833,732 filed Mar. 15, 2013 and entitled "Robot Having Arm With Unequal Link Lengths" which is hereby incorporated by reference herein in its entirety. Another example of an arm that utilizes non-circular pulleys is disclosed in U.S. Provisional Patent Application No. 62/132,066 filed Mar. 12, 2015 and entitled "2-Degree-of-Freedom 3-Link Robot Arm Mechanisms" which is hereby incorporated by reference herein in its entirety. Another example of an arm that utilizes non-circular pulleys is disclosed in U.S. Provisional Patent Application No. 62/135,490 filed Mar. 19, 2013 and entitled "Arm Mechanisms with Two End Effectors" which is hereby incorporated by reference herein in its entirety. Another example of an arm that utilizes non-circular pulleys is disclosed in U.S. Provisional Patent Application No. 62/137,458 filed Mar. 24, 2015 and entitled "Robot Arm Mechanisms with Two End Effectors" which is hereby incorporated by reference herein in its entirety.

Referring now to FIGS. 8A-E there is shown unequal link length single arm 100 with long first link 102 and short second link 104. Here, a robot arm linkage is shown with unequal first and second link lengths actuated by motors and a variable non-linear mechanical transmission to control the third link as a function of the angle between the first and second link. Here, the variable transmission may be defined to constrain the wrist joint 106 to follow a non-straight path 108 while the center 40 of substrate S follows a linear path 44. In alternate aspects, any suitable arm configuration or path(s) may be provided.

FIGS. 9A-9E show unequal link length dual arm 120 with no bridge. Arms 122, 124 share common upper arm 126 and have shorter forearms 128, 130. A variable ratio pulley system is provided where the wrist follows a non-straight path 132 and clears substrate 134 as the centerline of substrate 136 follows a linear path during extension and retraction. Both arms 122, 124 follow a similar path such that a bridge is not required to clear the adjacent substrate or arm upon extension and retraction. In alternate aspects, any suitable arm configuration or path(s) may be provided.

Referring also to FIGS. 10A-10E there is shown an extreme single arm 160 with a long forearm. Here, a unequal link length single arm 160 with short upper first link 162 and long second link 164 is shown. Here, a robot arm linkage is shown with unequal first and second link lengths actuated by motors and a variable non-linear mechanical transmission to control the third link as a function of the angle between the first and second link. Here, the variable transmission may be defined to constrain the wrist joint 166 to follow a non-straight path 168 while the center 170 of substrate 172 follows a straight linear path 174. This type of arm linkage configuration may increase overall arm reach for a given containment envelope 178 and reduce overall height of a dual arm linkage.

A pulley profile may be generated for a linkage constrained to any suitable path, for example, linear straight, non-straight or a combination of each. Here, methods may be provided for calculating the optimal link geometry and pulley profiles for a three link planar manipulator with two degrees of freedom (DOF). The three-link robot arm mechanism may be used to transfer material to/from side-by-side (laterally offset) stations in a semiconductor wafer processing tool or where the station is in line with the robot as shown in FIGS. 7-10.

Figure 11:
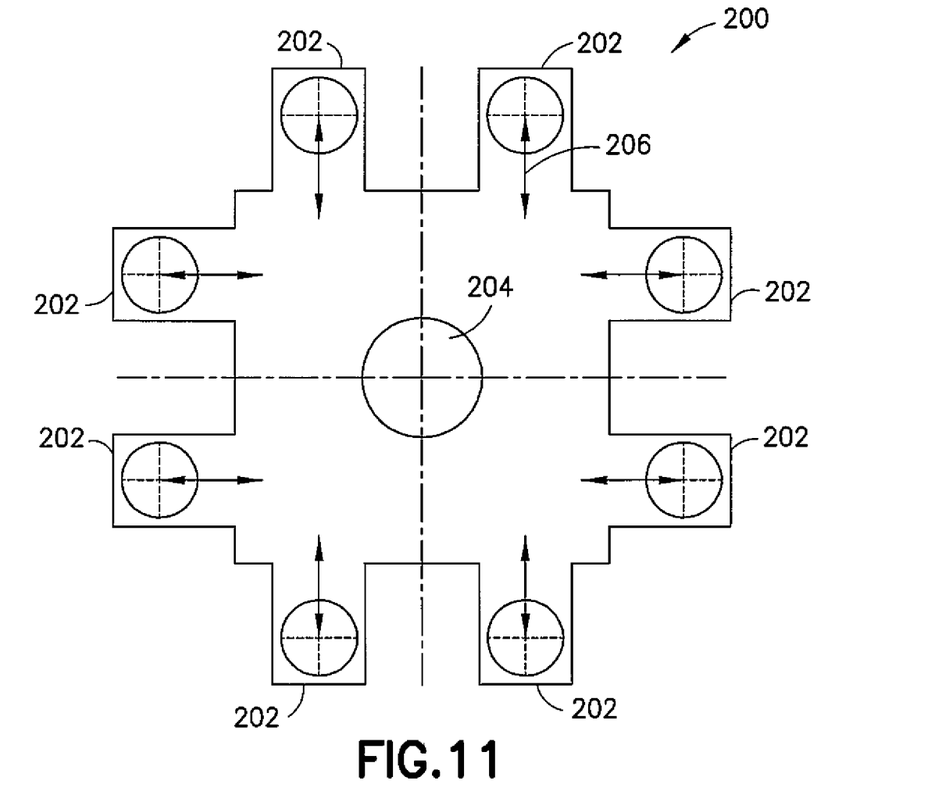
FIG. 11 is a schematic illustration of a semiconductor wafer processing tool.

An example layout of a semiconductor wafer processing tool 200 is diagrammatically depicted in the top view of FIG. 11. In this particular example, the tool features four pairs of side-by-side stations 202, e.g., one pair of load locks and three pairs of process module stations with a robot 204 on center. The present three-link arm mechanisms are designed to provide access to each of the stations in the tool along a predefined path, e.g., substantially straight-line path, with predefined orientation of the end-effector, e.g., along the straight-line path 206, as illustrated in the example of FIG. 11.

The desired robot trajectory is given based on the application requirements and consists of the desired position of the end effector (in Cartesian coordinates) and the desired orientation of the end effector. Since there are only two DOF (i.e. two axes of motion), only two of these coordinates may be commanded explicitly when the robot is in use. The third coordinate comes as a result of the link geometry and the pulley profile.

In a first method, the pulley shape is restricted to some parameterized functional form. This may be, for example, a polynomial, an ellipse, or any other suitable function. The parameters in this pulley shape function, along with the lengths of the three links, form the search space for a numerical optimization that seeks to minimize the difference between a desired and actual robot trajectory. This may be done by calculating the motion required to cause the end effector to track the desired XY position perfectly, then calculating the errors in the orientation coordinate.

A second method may be provided similar to the first method except that the search space for the numerical optimization is augmented with the path coordinates for the wrist and the motion is calculated to cause the wrist to track the desired trajectory perfectly. In this case the tracking error of the end effector is potentially non-zero for all three coordinates and the optimization cost is likewise a function of all three errors.

A third method does not restrict the pulley shape to any specific functional form. The search space for the optimization includes the link lengths and properties of the path such as via point locations and trajectory leg blend amounts. The motion is calculated so that the actual trajectory tracks the desired trajectory perfectly. The transmission ratio function and pulley profile are calculated directly from this in order to achieve perfect tracking. In order to optimize the result, the numerical optimization seeks to minimize the variations in the transmission ratio so that the pulley is as close to circular as possible while still maintaining perfect tracking.

A fourth method is similar to the third method except that the actual trajectory is permitted to deviate from the desired trajectory over some parts of the motion. In the parts of the motion where the tracking is not perfect, the calculation assumes that the transmission ratio takes on some specific functional form. The parameters that define that functional form are included in the search space for the optimization. The cost function for the optimization is a combination of minimizing the non-circularity of the pulley profile and minimizing the tracking error.

In one variation of this method, the transmission ratio is defined to be a constant value from the retracted position of the robot through some point along the extend motion path, after which the transmission ratio is varied in order to achieve perfect tracking in the region close to the extended position.

In another variation, the transmission ratio is defined to be a linearly changing value during the middle part of the extend motion and the beginning and end of the motion have variable transmission ratios to achieve perfect tracking in those regions.

Figure 12A:
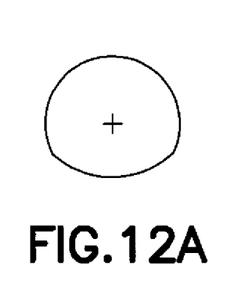
FIGS. 12A and 12B show some top plan views of example embodiments of non-circular pulleys.
Figure 12B:
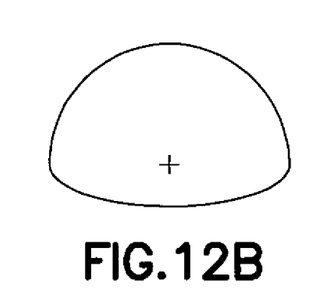

FIGS. 12A and 12B show some example embodiments of non-circular pulleys. The exemplary pulley profiles may be for an arm with unequal link lengths as described. By way of example, the profiles may be for a wrist pulley where the elbow pulley is circular. Here, a variable ratio between the elbow and the wrist pulley may be provided. Alternately, any suitable ratio may be provided, for example, a portion of the profile may be provided that has a fixed ratio while a different portion may have a variable ratio. The pulley profiles may be generated, for example, as described above.

An example embodiment may be provided in a substrate transport arm comprising a first link; a second link rotatably connected to the first link; a third link rotatably connected to the second link at a wrist joint, where the third link comprises an end effector configured to support a substrate thereon; and a mechanical transmission comprising a pulley, where the mechanical transmission is connected to the third link to control rotation of the third link on the second link, where the mechanical transmission is configured to control rotation of the third link as a function of an angle between the first and second links such that, as the first and second links are rotated relative to each other, the wrist joint follows a wrist path which comprises a curved portion, and where a center of the substrate supported on the end effector is moved along a substantially straight substrate path as the wrist joint follows the curved portion of the wrist path.

The first and second links may have link lengths which are not equal. The mechanical transmission may be configured to rotate the third link relative to the second link, as the first and second links are rotated relative to each other, such that the third link has a first movement and a second movement, where the third link comprises a non-translational movement during the first movement, and where the third link comprises a translational movement during the second movement. The pulley may be part of a variable ratio pulley system. The mechanical transmission may comprise at least one transmission belt on the pulley. The pulley may be non-circular. The first and second links may have link lengths which are not equal, where the mechanical transmission is configured to rotate the third link relative to the second link, as the first and second links are rotated relative to each other, such that the third link has a first movement and a second movement, where the third link is rotatably moved during the first movement, and where the third link comprises translational movement during the second movement, where the pulley is non-circular, where the pulley is part of a variable ratio pulley system, and where the mechanical transmission comprises at least one transmission belt on the pulley. The wrist path may comprise a straight portion, where the mechanical transmission is configured to move the third link with a rotational movement when the wrist joint follows the curved portion of the wrist path, and where the third link rotates relative to the second link and the third link moves with a translational movement when the wrist joint follows the straight portion of the wrist path. A drive may be connected to the first link and the second link, where the drive comprises at least two coaxial drive shafts, and there at least one transmission belt connect one of the drive shafts to the pulley and to at least one drive pulley connected to the second link.

An example method may be provided comprising: connecting links in series to at least partially form a substrate arm, where the links comprise: a first link; a second link rotatably connected to the first link; and a third link rotatably connected to the second link at a wrist joint, where the third link comprises an end effector configured to support a substrate thereon; and connecting a mechanical transmission to the third link, where the mechanical transmission is configured to control rotation of the third link on the second link as a function of an angle between the first and second links, where the mechanical transmission comprises a pulley, and where the mechanical transmission is configured such that, as the first and second links are rotated relative to each other: the wrist joint follows a wrist path which comprises a curved portion, and a center of the substrate supported on the end effector is moved along a substantially straight substrate path as the wrist joint follows the curved portion of the wrist path.

The first and second links may have link lengths which are not equal, where the pulley is non-circular, and where the links and the mechanical transmission are connected such that a rate of rotation of the third link on the second link at least partially varies relative to a rate of rotation of the second link on the first link as the end effector is moved from a retracted position to an extended position. The mechanical transmission may be connected to the third link to rotate the third link relative to the second link, as the first and second links are rotated relative to each other, such that the third link has a first movement and a second movement, where the third link has a non-translational movement during the first movement, and where the third link has a translational movement during the second movement. Connecting the mechanical transmission to the third link may comprise providing the pulley as part of a variable ratio pulley system. Connecting the mechanical transmission to the third link may comprise the mechanical transmission comprising at least one transmission belt mounted on the pulley. Connecting the mechanical transmission to the third link may comprise providing the pulley as a non-circular pulley. The links and the mechanical transmission may be connected to each other such that the wrist path comprises a straight portion, where the mechanical transmission is configured to move the third link with a non-translational movement when the wrist joint follows the curved portion of the wrist path, and where the third link rotates relative to the second link and where the third link moves with a translational movement when the wrist joint follows the straight portion of the wrist path.

An example method may be provided comprising: moving a second link relative to a first link of a substrate transport arm, where the substrate transport arm comprises the second link being rotatably connected to the first link, and a third link rotatably connected to the second link at a wrist joint, where the third link comprises an end effector configured to support a substrate thereon; and moving the third link relative to the second link as the second link is moved relative to the first link, where a mechanical transmission is connected to the third link and at least partially controls rotation of the third link on the second link as a function of an angle between the first and second links, where the mechanical transmission comprises a pulley, and where the mechanical transmission at least partially limits movement of the third link relative to the second link such that: the wrist joint follows a wrist path which comprises a curved portion, and a center of the substrate supported on the end effector is moved along a substantially straight substrate path as the wrist joint follows the curved portion of the wrist path.

Moving the third link relative to the second link may comprise, as the first and second links are rotated relative to each other, the third link has a first movement and a second movement, where the third link comprises a non-translational movement during the first movement, and where the third link comprises a translational movement during the second movement. The wrist path may comprise a straight portion, where the mechanical transmission is configured to move the third link with a rotational movement when the wrist joint follows the curved portion of the wrist path, and where the third link rotates relative to the second link and the third link moves with a translational movement when the wrist joint follows the straight portion of the wrist path. The first and second links may have link lengths which are not equal, where the pulley is non-circular, and where the links and the mechanical transmission are connected such that a rate of rotation of the third link on the second link at least partially varies relative to a rate of rotation of the second link on the first link as the end effector is moved from a retracted position to an extended position.

An example apparatus may comprise means for moving a second link relative to a first link of a substrate transport arm, where the substrate transport arm comprises the second link being rotatably connected to the first link, and a third link rotatably connected to the second link at a wrist joint, where the third link comprises an end effector configured to support a substrate thereon; and means for moving the third link relative to the second link as the second link is moved relative to the first link, where a mechanical transmission is connected to the third link and at least partially controls rotation of the third link on the second link as a function of an angle between the first and second links, where the mechanical transmission comprises a pulley, and where the mechanical transmission at least partially limits movement of the third link relative to the second link such that: the wrist joint follows a wrist path which comprises a curved portion, and a center of the substrate supported on the end effector is moved along a substantially straight substrate path as the wrist joint follows the curved portion of the wrist path.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A substrate transport arm comprising:
   a first link;
   a second link rotatably connected to the first link;
   a third link rotatably connected to the second link at a wrist joint, where the third link comprises an end effector configured to support a substrate thereon; and
   a mechanical transmission comprising a pulley, where the mechanical transmission is connected to the third link to control rotation of the third link on the second link, where the mechanical transmission is configured to control rotation of the third link on the second link as a function of an angle between the first and second links such that, as the first and second links are rotated relative to each other, the wrist joint follows a wrist path which comprises a curved portion, and where a center of the substrate supported on the end effector is moved along a substantially straight substrate path as the wrist joint follows the curved portion of the wrist path, where the substrate transport arm is configured such that the rotation of the third link relative to the second link is completely mechanically dependent upon, with the mechanical transmission on the second link, rotational location of the second link on the first link, where the rotation of the third link about the second link is mechanically constrained and limited by mechanical dependence based upon the function of the angle between the first and second links,
   where the first and second links have link lengths which are not equal, where the mechanical transmission is configured to rotate the third link relative to the second link, as the first and second links are rotated relative to each other, such that the third link has a first movement and a second movement, where the third link is rotatably moved during the first movement, and where the third link comprises translational movement during the second movement, where the pulley is non-circular, where the pulley is part of a variable ratio pulley system, and where the mechanical transmission comprises at least one transmission belt on the pulley.

2. A substrate transport arm as claimed in claim 1 where the wrist path comprises a straight portion, where the mechanical transmission is configured to move the third link with a rotational movement when the wrist joint follows the curved portion of the wrist path, and where the third link rotates relative to the second link and the third link moves with a translational movement when the wrist joint follows the straight portion of the wrist path.

3. An apparatus comprising:
   a substrate transport arm as claimed in claim 1; and
   a drive connected to the first link and the second link, where the drive comprises at least two coaxial drive shafts, and there at least one transmission belt connect one of the drive shafts to the pulley and to at least one drive pulley connected to the second link.

4. A substrate transport arm as claimed in claim 1 where the substrate transport arm is configured to provide the rotation of the third link about the second link based upon location of the second link on the first link, where the rotation is completely mechanically provided by the substrate transport arm in response to location of the second link on the first link.

5. A method comprising:
   connecting links in series to at least partially form a substrate arm, where the links comprise:
      a first link;
      a second link rotatably connected to the first link; and
      a third link rotatably connected to the second link at a wrist joint, where the third link comprises an end effector configured to support a substrate thereon; and
   connecting a mechanical transmission to the third link, where the mechanical transmission is configured to control rotation of the third link on the second link as a function of an angle between the first and second links, where the mechanical transmission comprises a pulley, and where the mechanical transmission is configured such that, as the first and second links are rotated relative to each other:
      the wrist joint follows a wrist path which comprises a curved portion, and
      a center of the substrate supported on the end effector is moved along a substantially straight substrate path as the wrist joint follows the curved portion of the wrist path,
   where the substrate arm, with the mechanical transmission on the second link, is configured to completely mechanically constrain and limit the rotation of the third link about the second link as the function of the angle between the first and second links, where the substrate arm is configured such that the rotation of the third link relative to the second link is configured to be provided, with the mechanical transmission on the second link, mechanically limited based upon mechanical dependence completely upon of location of the second link relative to the first link, where the first and second links have link lengths which are not equal, where the pulley is non-circular, and where the links and the mechanical transmission are connected such that a rate of rotation of the third link on the second link at least partially varies relative to a rate of rotation of the second link on the first link as the end effector is moved from a retracted position to an extended position.

6. A method as in claim 5 where the mechanical transmission is connected to the third link to rotate the third link relative to the second link, as the first and second links are rotated relative to each other, such that the third link has a first movement and a second movement, where the third link has a non-translational movement during the first movement, and where the third link has a translational movement during the second movement.

7. A method as in claim 5 where connecting the mechanical transmission to the third link comprises the mechanical transmission comprising at least one transmission belt mounted on the pulley.

8. A method as in claim 5 where the links and the mechanical transmission are connected to each other such that the wrist path comprises a straight portion, where the mechanical transmission is configured to move the third link with a non-translational movement when the wrist joint follows the curved portion of the wrist path, and where the third link rotates relative to the second link and where the third link moves with a translational movement when the wrist joint follows the straight portion of the wrist path.

9. A method as in claim 5 where the substrate arm is configured to provide the rotation of the third link about the second link, completely mechanically provided by the substrate transport arm, in response to location of the second link on the first link.

10. A method as in claim 5 further comprising connecting a drive to the substrate arm, where the drive comprises at least two drive motors with drive shafts.

11. A substrate transport arm comprising:
a first link;
a second link rotatably connected to the first link;
a third link rotatably connected to the second link at a wrist joint, where the third link comprises an end effector configured to support a substrate thereon; and
a mechanical transmission comprising a pulley, where the mechanical transmission is connected to the third link to control rotation of the third link on the second link, where the mechanical transmission is configured to control rotation of the third link as a function of an angle between the first and second links such that, as the first and second links are rotated relative to each other, the wrist joint follows a wrist path which comprises a curved portion, and where a center of the substrate supported on the end effector is moved along a substantially straight substrate path as the wrist joint follows the curved portion of the wrist path, where the pulley is part of a variable ratio pulley system.

12. A method comprising:
connecting links in series to at least partially form a substrate arm, where the links comprise:
a first link;
a second link rotatably connected to the first link; and
a third link rotatably connected to the second link at a wrist joint, where the third link comprises an end effector configured to support a substrate thereon; and
connecting a mechanical transmission to the third link, where the mechanical transmission is configured to control rotation of the third link on the second link as a function of an angle between the first and second links, where the mechanical transmission comprises a pulley, and where the mechanical transmission is configured such that, as the first and second links are rotated relative to each other:
the wrist joint follows a wrist path which comprises a curved portion, and
a center of the substrate supported on the end effector is moved along a substantially straight substrate path as the wrist joint follows the curved portion of the wrist path
where connecting the mechanical transmission to the third link comprises providing the pulley as a non-circular pulley.

13. A method comprising:
connecting links in series to at least partially form a substrate arm, where the links comprise:
a first link;
a second link rotatably connected to the first link; and
a third link rotatably connected to the second link at a wrist joint, where the third link comprises an end effector configured to support a substrate thereon; and
connecting a mechanical transmission to the third link, where the mechanical transmission is configured to control rotation of the third link on the second link as a function of an angle between the first and second links, where the mechanical transmission comprises a pulley, and where the mechanical transmission is configured such that, as the first and second links are rotated relative to each other:
the wrist joint follows a wrist path which comprises a curved portion, and
a center of the substrate supported on the end effector is moved along a substantially straight substrate path as the wrist joint follows the curved portion of the wrist path, where connecting the mechanical transmission to the third link comprises providing the pulley as part of a variable ratio pulley system.

* * * * *